United States Patent
Izumi et al.

(10) Patent No.: US 6,974,717 B2
(45) Date of Patent: Dec. 13, 2005

(54) SOLID STATE IMAGE DEVICE AND INCLUDING AN OPTICAL LENS AND A MICROLENS

(75) Inventors: Makoto Izumi, Mizuho (JP); Mitsuru Okigawa, Nagoya (JP); Kazuhiro Sasada, Hashima (JP); Naoteru Matsubara, Gifu (JP); Tatsuhiko Koide, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/637,664

(22) Filed: Aug. 11, 2003

(65) Prior Publication Data

US 2004/0033640 A1 Feb. 19, 2004

(30) Foreign Application Priority Data

Aug. 12, 2002 (JP) .................................... 2002-234564

(51) Int. Cl.$^7$ ............................................. H01L 21/00
(52) U.S. Cl. .............................. 438/57; 438/65; 438/69; 438/73
(58) Field of Search ............................ 438/57, 65, 69, 438/73; 427/74

(56) References Cited

U.S. PATENT DOCUMENTS 4,877,717 A * 10/1989 Suzuki et al. ............... 430/321
5,670,384 A * 9/1997 Needham ...................... 438/70
6,076,933 A * 6/2000 DiLoreto et al. ............ 359/614
6,535,249 B1 * 3/2003 Stavely ....................... 348/340

FOREIGN PATENT DOCUMENTS

| JP | 6-53451 | 2/1994 | |
| JP | 09-148549 | 6/1997 | |
| JP | 10-229180 | * 8/1998 | ........... H01L/27/14 |
| JP | P3009419 | 12/1999 | |
| JP | P2001-94086 A | 4/2001 | |
| JP | P2001-111017 A | 4/2001 | |

OTHER PUBLICATIONS

Stanley Wolf Ph.D. in Silicon Processing for the VLSI Era, vol. 2: Process Integration, Lattice Press, 1990, pp. 229–232.*

* cited by examiner

Primary Examiner—William M. Brewster
(74) Attorney, Agent, or Firm—McDermott Will & Emery LLP

(57) ABSTRACT

A solid state image device capable of attaining high condensability also when integrating an optical lens and a solid state image sensor with each other is provided. This solid state image device comprises an optical lens, a solid state image sensor including a microlens, and a resin layer formed between the optical lens and the microlens of the solid state image sensor. Thus, the solid state image device can refract light incident upon the microlens from the resin layer also when the resin layer is formed between the solid state image sensor and the optical lens.

12 Claims, 9 Drawing Sheets

SOLID STATE IMAGE DEVICE AND INCLUDING AN OPTICAL LENS AND A MICROLENS

BACKGROUND OF THE INVENTION

1. Field of the Invention

The present invention relates to a solid state image device and a manufacturing method thereof, and more particularly, it relates to a solid state image device including a solid state image sensor having a photoelectric conversion function and a manufacturing method thereof.

2. Description of the Background Art

A solid state image device comprising a solid state image sensor having a photoelectric conversion function is known in general. FIG. 21 schematically illustrates the overall structure of a conventional solid state image device. FIG. 22 is a sectional view of a solid state image sensor part of the conventional solid state image device shown in FIG. 21. The structure of the conventional solid state image device is now described with reference to FIGS. 21 and 22.

In the conventional solid state image device, an optical lens 104 for condensing reflected light from an object is provided above a solid state image sensor 103 through an air space 105 having a refractive index of 1, as shown in FIG. 21.

More specifically, photoreceptive parts 107 having photoelectric conversion functions of converting incident light to signal charges are formed on prescribed regions of an Si substrate 106, as shown in FIG. 22. An interlayer dielectric film 108 is formed on the Si substrate 106 formed with the photoreceptive parts 107. Shielding films 109 are formed on prescribed regions of the interlayer dielectric film 108. These shielding films 109 have functions of preventing the prescribed regions from incidence of light. Another interlayer dielectric film 110 is formed to cover the shielding films 109 and the interlayer dielectric film 108. A resin film 111 having upwardly projecting portions 111a and flat portions 111b is formed on the interlayer dielectric film 110. This resin film 111 has a refractive index of about 1.5. The projecting portions 111a of the resin film 111 have functions serving as microlenses condensing light. In other words, the surfaces of the projecting portions 111a of the resin film 111 inwardly refract light incident upon the air space 105 through the optical lens 104 (see FIG. 21) due to the refractive index (about 1.5) of the resin film 111 larger than the refractive index (1.0) of the air space 105. Thus, the photoreceptive parts 107 condense light incident upon the projecting portions 111a of the resin film 111.

Following recent miniaturization of a portable apparatus or the like mounted with such a solid state image device, miniaturization of the solid state image device has also been required. However, the conventional solid state image device, including the solid-state image sensor 103 and the optical lens 104, shown in FIG. 21 is hard to miniaturize due to the solid state image sensor 103 and the optical lens 104 separately provided through the air space 105.

In order to miniaturize such a solid-state image device, there has generally been proposed a solid state image device formed by bonding a solid state image sensor and an optical lens to each other through a resin layer thereby integrating the solid state image sensor and the optical lens with each other.

In the aforementioned generally proposed solid state image device, however, the resin layer having a refractive index of about 1.5 is used for bonding the solid state image sensor and the optical lens to each other. When a conventional resin film having a refractive index of about 1.5 for serving as a microlens is formed on the solid state image sensor in this case, it is inconveniently difficult to refract light incident upon the resin film serving as a microlens from the resin layer due to the substantially identical refractive indices (about 1.5) of the resin layer serving as a bonding layer and the resin film serving as a microlens. In the generally proposed solid state image device, therefore, the solid state image sensor and the optical lens are bonded to each other through the resin layer serving as a bonding layer without forming a microlens on the solid state image sensor. Consequently, it is disadvantageously difficult to provide the solid state image device with high condensability when integrating the optical lens and the solid state image sensor with each other.

SUMMARY OF THE INVENTION

An object of the present invention is to provide a solid state image device capable of attaining high condensability.

A solid state image device according to a first aspect of the present invention comprises an optical lens, a solid state image sensor including a microlens and a resin layer formed between the optical lens and the microlens of the solid state image sensor. In the present invention, the term "resin layer" designates a wide concept including not only an organic polymer layer but also an inorganic SOG layer, an Si-based polymer layer and the like.

In the solid state image device according to the first aspect, as hereinabove described, the microlens is provided on the solid state image sensor in the structure formed with the resin layer between the optical lens and the solid state image sensor so that the solid state image device can refract light incident upon the microlens from the resin layer formed between the solid state image sensor and the optical lens if the microlens is structured to be capable of refracting the light from the resin layer. Thus, the solid state image device can condense the light incident upon the microlens from the resin layer. Consequently, the solid state image device can attain high condensability.

In the aforementioned solid state image device according to the first aspect, the optical lens and the microlens of the solid state image sensor are preferably integrally formed through the resin layer. According to this structure, the solid state image device can be inhibited from increase in thickness as compared with that having an optical lens and a microlens of a solid state image sensor formed separately from each other, whereby the solid state image device can be miniaturized.

In the aforementioned solid state image device according to the first aspect, the microlens of the solid state image sensor preferably has a refractive index larger than the refractive index of the resin layer. According to this structure, the solid state image device can easily inwardly refract light incident upon the microlens from the resin layer, whereby the light can be easily condensed on a photoreceptive part.

In the aforementioned solid state image device according to the first aspect, the microlens of the solid state image sensor preferably includes a first film having an upwardly projecting shape and a second film, formed on the first film, having an upwardly projecting shape reflecting the upwardly projecting shape of the first film. According to this structure, the second film can relax difference between the refractive indices of the resin layer and the first film when the same has an intermediate refractive index between those of the resin layer and the first film, for example. Thus, the quantity of reflection of light incident upon the first film from the resin layer can be inhibited from increase resulting from large difference between the refractive indices, whereby condensation efficiency can be inhibited from reduction.

In the aforementioned structure provided with the microlens including the first and second films, the first film and the second film are preferably made of materials having the same refractive index. According to this structure, the first and second films can be easily inhibited from causing difference between the refractive indices thereof, whereby the interface between the first and second films can be easily inhibited from reflecting light.

In this case, the first film and the second film are preferably formed by SiN films. According to this structure, the microlens having a larger refractive index than the resin layer can be easily obtained while inhibiting the interface between the first and second films from reflecting light.

In the aforementioned structure provided with the microlens including the first and second films, the first film is preferably formed with a plurality of upwardly projecting shapes at prescribed intervals, and the second film is preferably formed with a plurality of upwardly projecting shapes to fill up gaps of the first film. According to this structure, each adjacent pair of the upwardly projecting shapes of the second film are directly connected with each other with no prescribed interval, whereby the area of the second film serving as the microlens is increased as compared with the area of the first film serving as the microlens. Thus, condensation efficiency can be improved.

In this case, each adjacent pair of the upwardly projecting shapes of the second film are preferably connected with each other to include no substantially flat region on the boundary therebetween. According to this structure, it is possible to suppress generation of light not condensed on the boundary between each adjacent pair of the upwardly projecting shapes of the second film dissimilarly to a case of including a substantially flat region having no function of condensing light on a photoreceptive part on the boundary between each adjacent pair of the upwardly projecting shapes of the second film. Thus, condensation efficiency can be further improved as compared with the case of including a substantially flat region having no function of condensing light on a photoreceptive part on the boundary between each adjacent pair of the upwardly projecting shapes of the second film.

In the aforementioned structure having the second film formed with the upwardly projecting shapes to fill up the gaps of the first film, the boundary between each adjacent pair of the upwardly projecting shapes of the second film preferably has a thickness of at least 10 nm. According to this structure, the boundary between each adjacent pair of the upwardly projecting shapes of the second film can be effectively inhibited from infiltration of moisture. Thus, the solid state image device can be improved in moisture resistance. When the boundary between each adjacent pair of the upwardly projecting shapes of the second film is formed to have a thickness of at least 10 nm, no passivation film may be separately formed on the microlens for preventing infiltration of moisture, whereby the thickness of the solid state image device can be inhibited from increase.

The aforementioned solid state image device according to the first aspect preferably further comprises a recessed third film formed on the solid state image sensor, and the microlens of the solid state image sensor preferably includes a fourth film, embedded in the recessed portion of the third film, exhibiting a larger refractive index than the third film and having a downwardly projecting shape. According to this structure, the downwardly projecting surface of the fourth film defining the boundary between the fourth and third films can inwardly refract light due to the refractive index of the fourth film larger than that of the third film, whereby no difference may be provided between the refractive indices of the resin layer and the fourth film. Thus, the material for the resin layer can be selected regardless of the refractive index of the fourth film, whereby the degree of freedom in selection of the material for the resin layer can be enlarged.

In the aforementioned structure provided with the microlens including the fourth film, the fourth film is preferably formed by an SiN film. According to this structure, the microlens having a larger refractive index than the resin layer can be easily obtained.

In the aforementioned structure provided with the fourth film formed by an SiN film, the third film is preferably formed by an SOG film. According to this structure, the third film formed by an SOG film with a smaller refractive index than the fourth film can be easily obtained. Thus, the interface between the fourth film of the microlens formed by an SiN film and the third film formed by an SOG film can easily refract light.

A method of manufacturing a solid state image device according to a second aspect of the present invention comprises steps of forming a first film having a prescribed refractive index on a solid state image sensor, forming a resist layer on a prescribed region of the first film, performing heat treatment thereby working the resist layer to have an upwardly projecting shape, simultaneously etching the resist layer and the first film thereby working the first film to have an upwardly projecting shape reflecting the upwardly projecting shape of the resist layer and integrally forming the solid state image sensor including the first film having the upwardly projecting shape and an optical lens through a resin layer having a smaller refractive index than the first film.

In the method of manufacturing a solid state image device according to the second aspect, as hereinabove described, the first film formed on the solid state image sensor is worked to have the upwardly projecting shape so that the solid state image sensor including the first film and the optical lens are thereafter integrally formed through the resin layer having a smaller refractive index than the first film, whereby the solid state image device can inwardly refract light incident upon the first film serving as a microlens from the resin layer also when the solid state image sensor and the optical lens are integrally formed through the resin layer. Thus, a photoreceptive part can condense the light incident upon the microlens from the resin layer, whereby the solid state image device can be easily formed with high condensability.

The aforementioned method of manufacturing a solid state image device according to the second aspect preferably further comprises a step of forming a second film exhibiting a refractive index larger than the refractive index of the resin layer and equivalent to or not more than the refractive index of the first film and having an upwardly projecting shape to fill up a gap between the first film and an adjacent first film in advance of the step of integrally forming the solid state image sensor and the optical lens through the resin layer. According to this structure, the solid state image device can introduce light incident from above the gap between the first film and the adjacent first film into the second film. At this time, the light incident upon the second film from above the gap between the first film and the adjacent first film is inwardly refracted due to the refractive index of the second film larger than that of the resin layer. Thus, the photoreceptive part can condense not only light incident from above the first film but also the light incident from above the gap between the first film and the adjacent first film through the second film, whereby condensation efficiency can be further improved. Further, the second film can relax difference between the refractive indices of the resin layer and the first film when having an intermediate refractive index between those of the resin layer and first films. Thus, the quantity of reflection of light incident upon the first film from the resin layer can be inhibited from increase resulting from large difference between the refractive indices, whereby condensation efficiency can be inhibited from reduction.

In the aforementioned structure including the step of forming the second film, the step of forming the second film preferably includes a step of connecting the upwardly projecting shape and an adjacent upwardly projecting shape of the second film to include no substantially flat region on the boundary therebetween. According to this structure, it is possible to suppress generation of light not condensed on the boundary between the upwardly projecting shape and the adjacent upwardly projecting shape of the second film dissimilarly to a case of forming the boundary between the upwardly projecting shape and the adjacent upwardly projecting shape of the second film to include a substantially flat region having no function of condensing light on the photoreceptive part. Thus, condensation efficiency can be further improved as compared with the case of forming the boundary between the upwardly projecting shape and the adjacent upwardly projecting shape of the second film to include a substantially flat region.

In the aforementioned structure including the steps of forming the first film and forming the second film, the first film and the second film are preferably made of materials having the same refractive index. According to this structure, the first and second films can be easily inhibited from causing difference between the refractive indices thereof, whereby the interface between the first and second films can be easily inhibited from reflecting light.

In this case, the first film and the second film are preferably formed by SiN films. According to this structure, the first and second films can be easily formed with a larger refractive index than the resin layer while inhibiting the interface therebetween from reflecting light.

A method of manufacturing a solid state image device according to a third aspect of the present invention comprises steps of forming a columnar part on a prescribed region of a solid state image sensor, applying a film material to cover the columnar part thereby forming a recessed coating, forming a lens film exhibiting a larger refractive index than the coating and having a downwardly projecting shape to fill up the recessed portion of the coating and integrally forming the solid state image sensor including the lens film having the downwardly projecting shape and an optical lens through a resin layer. In the present invention, the term "columnar part" designates a wide concept including not only a columnar one but also a wall-like one.

In the method of manufacturing a solid state image device according to the third aspect, as hereinabove described, the recessed coating is formed on the solid state image sensor while the lens film exhibiting a larger refractive index than the coating and having a downwardly projecting shape is formed to fill up the recessed portion of the coating so that the solid state image sensor including the lens film and the optical lens are thereafter integrally formed through the resin layer, whereby the solid state image device can inwardly refract light on the downwardly projecting surface of the lens film defining the boundary between the lens film and the coating due to the refractive index of the lens film larger than that of the coating, also when the solid state image sensor and the optical lens are integrally formed through the resin layer. Thus, no difference may be provided between the refractive indices of the resin layer and the lens film. Consequently, the material for the resin layer can be selected regardless of the refractive index of the lens film, whereby the degree of freedom in selection of the material for the resin layer can be enlarged.

In the aforementioned method of manufacturing a solid state image device according to the third aspect including the step of forming the lens film, the lens film is preferably formed by an SiN film. According to this structure, the lens film can be easily formed with a larger refractive index than the resin layer.

In the aforementioned structure including the step of forming the lens film by an SiN film, the coating is preferably formed by an SOG film. According to this structure, the coating can be easily formed with a smaller refractive index than the lens film formed by an SiN film. Thus, the solid state image device can easily refract light on the interface between the lens film formed by an SiN film and the coating formed by an SOG film.

In the aforementioned method of manufacturing a solid state image device according to the third aspect, the width of an upper portion of the columnar part is preferably smaller than the width of a lower portion. According to this structure, the interval between the downwardly projecting lens film and an adjacent downwardly projecting lens film can be so reduced as to increase the length of the downwardly projecting surface of the lens film. Thus, the area of the lens film can be so increased that condensation efficiency can be further improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

The structure of a solid state image device according to a first embodiment of the present invention is described with reference to FIGS. 1 and 2.

Figure 1:
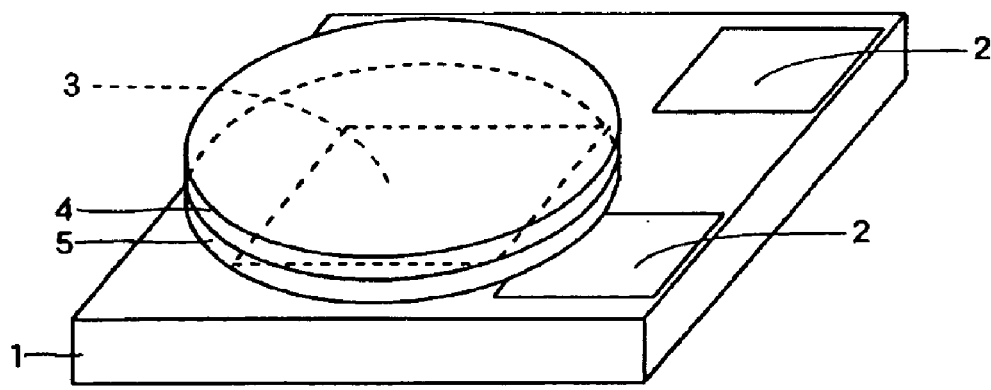
FIG. 1 is a schematic perspective view showing a solid state image device according to a first embodiment of the present invention.

According to the first embodiment, peripheral circuits 2 such as drivers and a solid state image sensor 3 are built on a package substrate 1, as shown in FIG. 1. An optical lens 4 for condensing reflected light from an object is integrally formed on the solid state image sensor 3 through a resin layer 5. This resin layer 5 consists of epoxy resin having a thickness of about 1 mm to about 2 mm, and has a refractive index of about 1.5.

Figure 2:
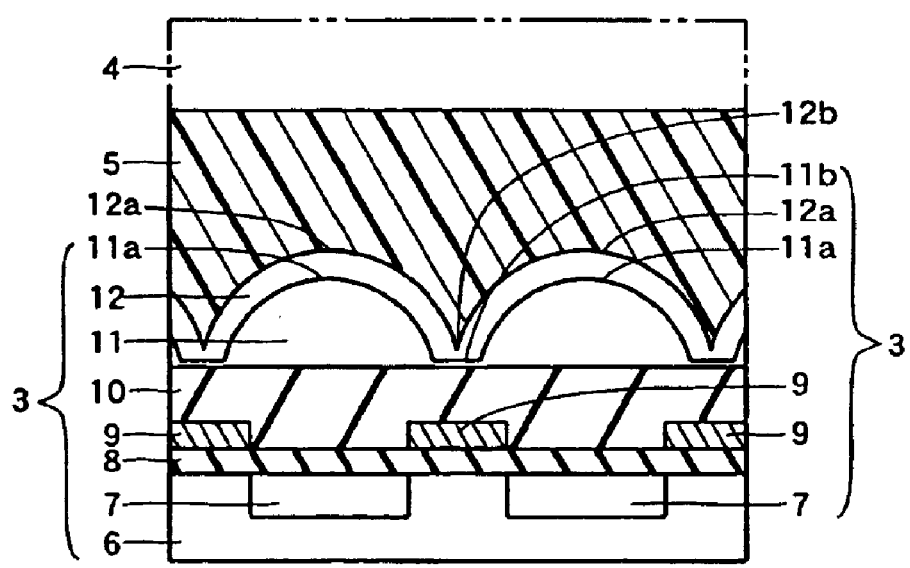
FIG. 2 is a sectional view of a portion around a solid state image sensor of the solid state image device according to the first embodiment shown in FIG. 2.

More specifically, photoreceptive parts 7 having a photoelectric conversion function of converting incident light to signal charges are formed on prescribed regions of an Si substrate 6 in the solid state image sensor 3, as shown in FIG. 2. An interlayer dielectric film 8 of $SiO_2$ having a thickness of about 0.6 μm is formed on the Si substrate 6 formed with the photoreceptive parts 7. The interlayer dielectric film 8 of $SiO_2$ has a refractive index of about 1.46. Shielding films 9 of Al having a thickness of about 150 nm (about 0.15 μm) are formed on prescribed regions of the interlayer dielectric film 8. These shielding films 9 have a function of preventing the prescribed regions from incidence of light. Another interlayer dielectric film 10 of $SiO_2$ having a thickness of about 1.7 μm is formed to cover the shielding films 9 and the interlayer dielectric film 8. The interlayer dielectric film 10 of $SiO_2$ has a refractive index of about 1.46.

According to the first embodiment, an SiN film 11 having a plurality of upwardly projecting portions 11a and flat potions 11b is formed on the interlayer dielectric film 10, as shown in FIG. 2. The projecting portions 11a of the SiN film 11 are arranged above the photoreceptive parts 7 and partial regions of the shielding films 9, and have a height of about 1.52 μm from the flat portions 11b and a radius of curvature of about 2.82 μm. The flat portions 11b of the SiN film 11 are arranged above other partial regions of the shielding films 9, and have a width of about 0.2 μm and a thickness of about 0.3 μm. The SiN film 11 has a refractive index of about 2.05. Another SiN film 12 having a plurality of upwardly projecting portions 12a reflecting the upwardly projecting shapes of the projecting portions 11a of the SiN film 11 is formed on the SiN film 11. The plurality of projecting portions 12a of the SiN film 12 are formed to fill up the flat portions 11b of the SiN film 11. The projecting portions 12a of the SiN film 12 have a thickness of about 0.1 μm. Each adjacent pair of the projecting portions 12a of the SiN film 12 are connected with each other to include no substantially flat region on the boundary 12b therebetween. The boundary 12b between each adjacent pair of the projecting portions 12a of the SiN film 12 has a thickness of at least 10 nm. The SiN film 12 has a refractive index of about 2.05. The SiN films 11 and 12 have functions serving as microlenses condensing light. The SiN film 11 is an example of the "microlens" or the "first film" in the present invention, and the SiN film 12 is an example of the "microlens" or the "second film" in the present invention.

The optical lens 4 is integrally formed on the SiN film 12 through the resin layer 5 consisting of the epoxy resin having the refractive index of about 1.5.

According to the first embodiment, as hereinabove described, the optical lens 4 and the SiN film 12 of the solid state image sensor 3 are integrally formed through the resin layer 5, whereby the thickness of the solid state image device can be inhibited from increase as compared with a case of forming the optical lens 4 separately from the SiN film 12 of the solid state image sensor 3 so that the solid state image device can be miniaturized.

According to the first embodiment, further, the SiN films 11 and 12 serving as microlenses having the refractive indices (about 2.05) larger than the refractive index (about 1.5) of the resin layer 5 are provided on the photoreceptive parts 7 of the solid state image sensor 3 integrally formed with the optical lens 4 through the resin layer 5 as hereinabove described, whereby the solid state image device can inwardly refract light incident upon the SiN films 11 and 12 serving as microlenses from the resin layer 5 also when the solid state image sensor 3 and the optical lens 4 are integrally formed through the resin layer 5 having the refractive index of about 1.5. Thus, the photoreceptive parts 7 can condense the light incident upon the SiN films 11 and 12 serving as microlenses from the resin layer 5, whereby an optical lens-integrated solid state image device having high condensability can be obtained.

According to the first embodiment, in addition, the plurality of projecting portions 12a of the SiN film 12 are so formed as to fill up the flat portions 11b of the SiN film 11 as hereinabove described, whereby each adjacent pair of the projecting portions 12a of the SiN film 12 are directly connected with each other with no prescribed interval, whereby the area of the SiN film 12 serving as a microlens is increased as compared with that of the SiN film 11 serving as a microlens. Thus, condensation efficiency can be improved.

According to the first embodiment, further, each adjacent pair of the projecting portions 12a of the SiN film 12 are connected with each other to include no substantially flat region on the boundary 12b as hereinabove described, whereby it is possible to suppress generation of light not condensed on the boundary 12b between each adjacent pair of the projecting portions 12a of the SiN film 12 dissimilarly to a case of including a substantially flat region having no function of condensing light on each photoreceptive part 7 on the boundary 12b between each adjacent pair of the projecting portions 12a of the SiN film 12. Thus, condensation efficiency can be further improved as compared with the case of including a substantially flat region on the boundary 12b between each adjacent pair of the projecting portions 12a of the SiN film 12.

According to the first embodiment, further, the boundary 12b between each adjacent pair of the projecting portions 12a of the SiN film 12 is so formed as to have the thickness of at least 10 nm, whereby moisture can be effectively inhibited from infiltration through the boundary 12b between each adjacent pair of the projecting portions 12a of the SiN film 12. Thus, the solid state image device can be improved in moisture resistance. In addition, the boundary 12b between each adjacent pair of the projecting portions 12a of the SiN film 12 is so formed as to have the thickness of at least 10 nm, whereby no passivation film may be separately provided on the SiN film 12 for preventing infiltration of moisture and hence the thickness of the solid state image device can be inhibited from increase.

A method of manufacturing the solid state image device according to the first embodiment is now described with reference to FIGS. 1 to 9.

Figure 3:
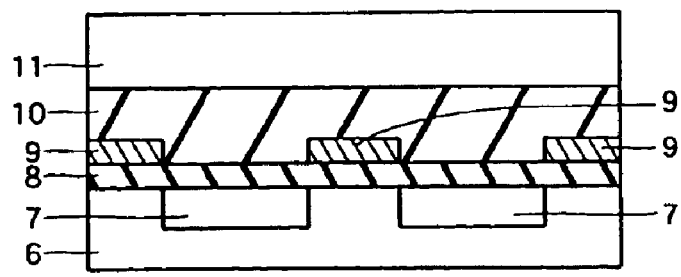
FIGS. 3 to 8 are sectional views for illustrating a method of manufacturing the solid state image device according to the first embodiment shown in FIG. 1.

First, the interlayer dielectric film 8 of $SiO_2$ having the thickness of about 0.6 µm is formed on the Si substrate 6 formed with the photoreceptive parts 7, as shown in FIG. 3. The shielding films 9 of Al having the thickness of about 150 nm are formed on the prescribed regions of the interlayer dielectric film 8. Then, the interlayer dielectric film 10 of $SiO_2$ having the thickness of about 1.7 µm is formed to cover the shielding films 9 and the interlayer dielectric film 8. Thereafter the SiN film 11 having a thickness of about 2.5 µm is formed on the interlayer dielectric film 10 by CVD (chemical vapor deposition).

Figure 4:
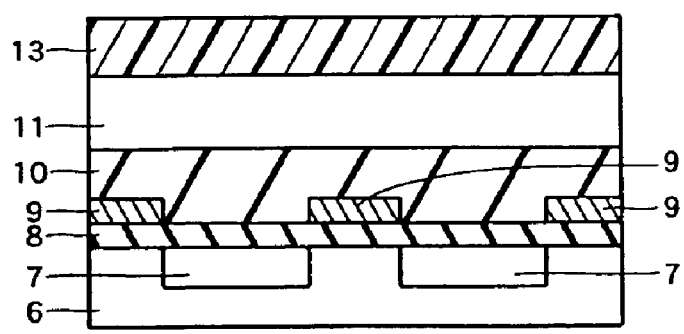

Then, a resist layer 13 having a thickness of about 2 µm is applied onto the SiN film 11, as shown in FIG. 4.

Figure 5:
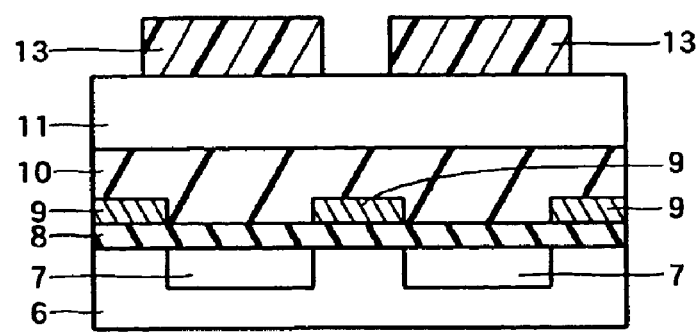
Figure 6:
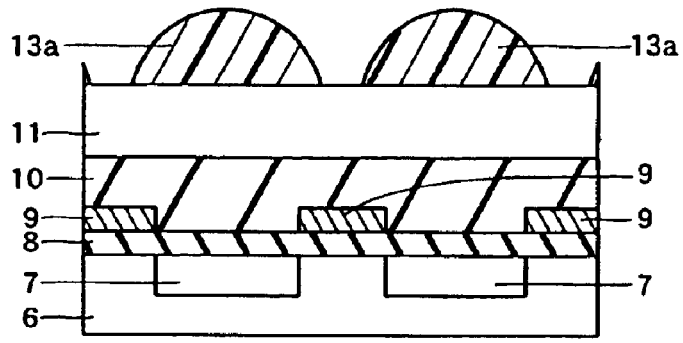

Then, the resist layer 13 is worked into resist films 13 of about 4.8 µm in width by lithography so that the distance between each adjacent pair of the resist films 13 is about 0.4 µm, as shown in FIG. 5. Thereafter ashing is so performed as to remove a thin resist portion (not shown) remaining between each adjacent pair of the resist films 13 from the SiN film 11. This ashing is performed with $O_3$ gas under a pressure of about 1 atm. at a temperature of about 200° C. to about 400° C. for about 5 seconds to about 30 seconds. Thereafter heat treatment is performed at a temperature of about 150° C. for about 30 minutes, thereby improving flowability of the resist films 13. Thus, the resist films 13 are converted to resist films 13a having upwardly projecting shapes due to surface tension, as shown in FIG. 6.

Figure 7:
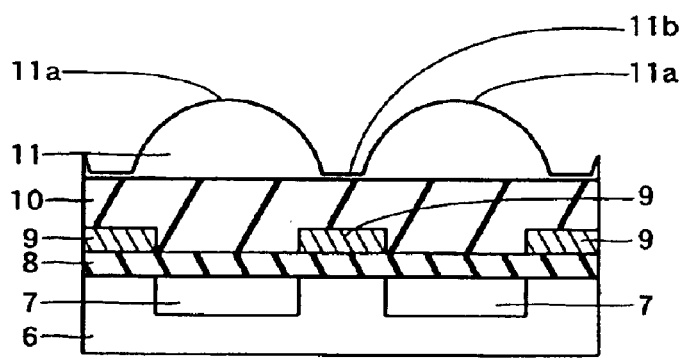

The upwardly projecting resist films 13a and the SiN film 11 are simultaneously etched thereby working the SiN film 11 to have the upwardly projecting portions 11a reflecting the upwardly projecting shapes of the resist films 13a, as shown in FIG. 7. More specifically, the SiN film 11 is worked into the shape having the upwardly projecting portions 11a with the radius of curvature of about 2.82 µm and the height of about 1.52 µm from the flat portions 11b and the flat portions 11b with the width of about 0.2 µm and the thickness of about 0.3 µm. In this etching, the quantity of oxygen gas is so increased as to also perform ashing on the resist films 13a at the same time, thereby removing the resist films 13a. More specifically, the etching is performed under a gas pressure of about 19.95 Pa to about 39.9 Pa with $CHF_3$ gas of about 0 ml/s to about 15 ml/s, $CF_4$ gas of about 60 ml/s to about 100 ml/s, Ar gas of about 600 ml/s to about 900 ml/s and $O_2$ gas of about 25 ml/s to about 35 ml/s at high-frequency power of about 120 W to about 200 W.

Figure 8:
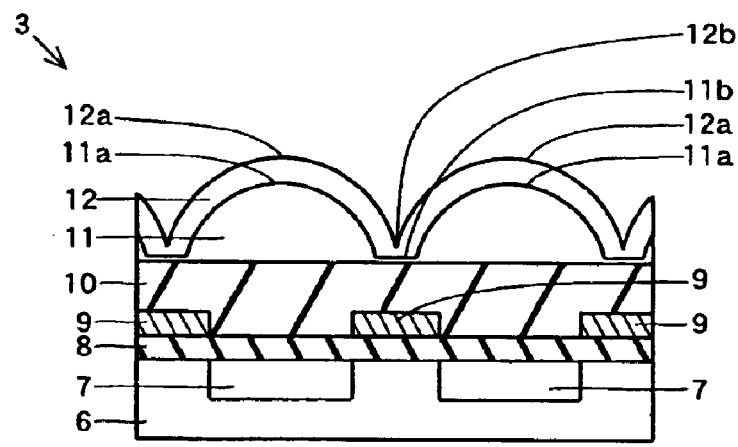

Then, the SiN film 12 having the upwardly projecting portions 12a reflecting the upwardly projecting shapes of the projecting portions 11a of the SiN film 11 is formed on the SiN film 11 having the projecting portions 11a an the flat portions 11b by CVD, as shown in FIG. 8. More specifically, the SiN film 12 is formed to have the plurality of upwardly projecting portions 12a of about 0.1 µm in thickness on the projecting portions 11a of the SiN film 11 so that the projecting portions 12a fill up the flat portions 11b of the SiN film 11. Each adjacent pair of the projecting portions 12a of film 11. The boundary 12b between each adjacent pair of the projecting portions 12a of the SiN film 12 is formed to have the thickness of at least 10 nm. No flat portions are preferably formed on the surfaces of the projecting portions 12a of the SiN film 12, as shown in FIG. 8. Thus, the solid state image sensor 3 is formed with the SiN films 11 and 12 serving as microlenses.

Figure 9:
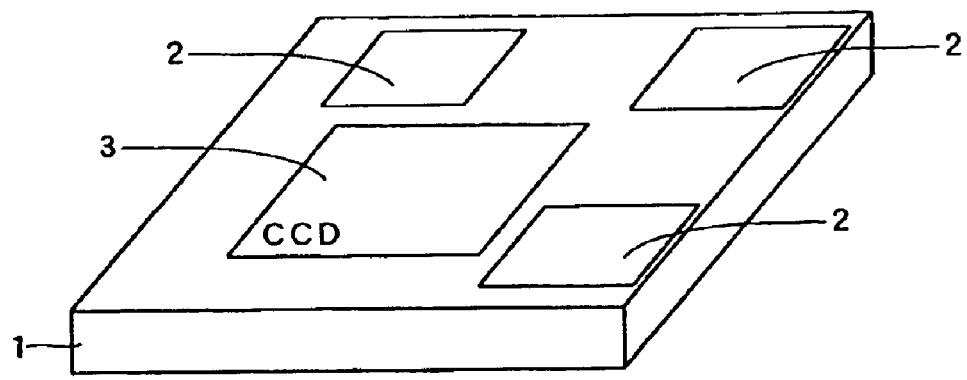
FIG. 9 is a schematic perspective view for illustrating the method of manufacturing the solid state image device according to the first embodiment shown in FIG. 1.

Finally, the peripheral circuits 2 such as drivers and the solid state image sensor 3 shown in FIG. 8 are built on the package substrate 1, as shown in FIG. 9. The solid state image sensor 3 and the optical lens 4 are integrally formed through the resin layer 5 consisting of the epoxy resin having the refractive index of about 1.5 and the thickness of about 1 mm to about 2 mm, as shown in FIGS. 1 and 2. Thus, the solid state image device according to the first embodiment is formed.

(Second Embodiment)

A solid state image device according to a second embodiment of the present invention is described with reference to a solid state image sensor 23 provided with downwardly projecting SiN films 33 for serving as microlenses, dissimilarly to the aforementioned first embodiment. The remaining structure of the solid state image device according to the second embodiment is similar to that of the solid state image device according to the first embodiment except microlens parts.

Figure 10:
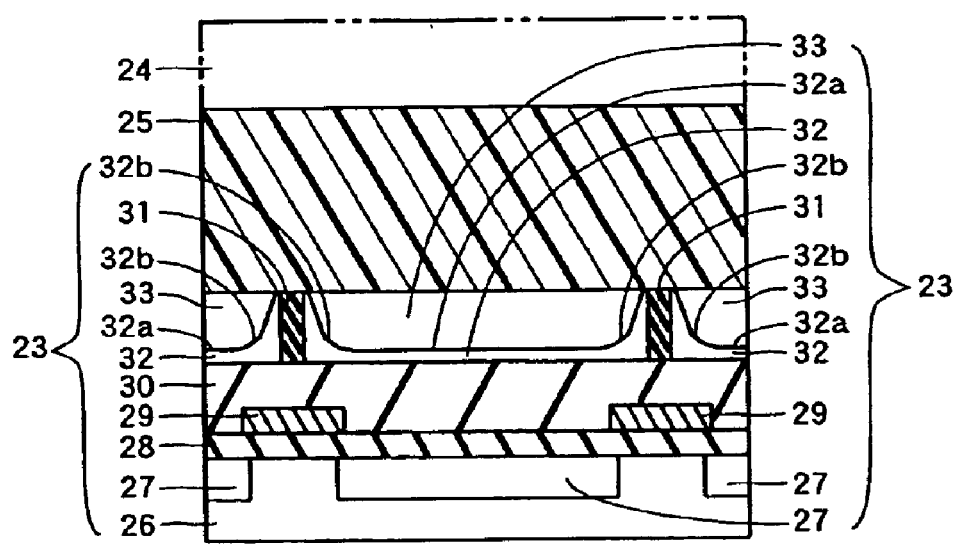
FIG. 10 is a sectional view showing a portion around a solid state image sensor of a solid state image device according to a second embodiment of the present invention.

According to the second embodiment, an optical lens 24 for condensing reflected light from an object is integrally formed on the solid state image sensor 23 through a resin layer 25, as shown in FIG. 10. The resin layer 25 consists of epoxy resin having a thickness of about 1 mm to about 2 mm, and has a refractive index of about 1.5.

More specifically, photoreceptive parts 27 having a photoelectric conversion function of converting incident light to signal charges are formed on prescribed regions of an Si substrate 26 in the solid state image sensor 23, as shown in FIG. 10. An interlayer dielectric film 28 of $SiO_2$ having a thickness of about 0.6 µm is formed on the Si substrate 26 formed with the photoreceptive parts 27. The interlayer dielectric film 28 of $SiO_2$ has a refractive index of about 1.46. Shielding films 29 of Al having a thickness of about 150 nm (about 0.15 µm) are formed on prescribed regions of the interlayer dielectric film 28. The shielding films 29 have a function of preventing the prescribed regions from incidence of light. Another interlayer dielectric film 30 of $SiO_2$ having a thickness of about 1.7 µm is formed to cover the shielding films 29 and the interlayer dielectric film 28. The interlayer dielectric film 30 of $SiO_2$ has a refractive index of about 1.46.

According to the second embodiment, columnar parts 31 of $SiO_2$ are formed on nonsensitve regions of the interlayer dielectric film 30, as shown in FIG. 10. The columnar parts 31 are provided in the form of a lattice in plan view to have a width of about 0.13 µm and a height of about 2.5 µm so that the distance between each adjacent pair of the columnar parts 31 is about 5 µm. Each columnar part 31 is in the form of a rectangle having upper and lower portions of the same width. Recessed SOG films 32 are formed to cover the upper surface of the interlayer dielectric film 30 and side surfaces of the columnar parts 31. The SOG films 32 have a refractive index of about 1.4. Flat portions 32a of the SOG films 32 are arranged above the photoreceptive parts 27, and have a width of about 2 μm and a thickness of about 0.5 μm. Curved parts 32b of the SOG films 32 are arranged above portions close to the shielding films 29, and have a radius of curvature of about 2.3 μm. The SiN films 33 having a thickness of about 2 μm are embedded in recessed portions consisting of the flat portions 32a and the curved portions 32b of the SOG films 32. Thus, the SiN films 33 have downwardly projecting shapes. The downwardly projecting SiN films 33 have a refractive index of about 2.05. The projecting lower surfaces of the SiN films 33 function as microlenses condensing light. The SOG films 32 are examples of the "coating" or the "third film" in the present invention, and the SiN films 33 are examples of the "microlens", the "fourth film" or the "lens film" in the present invention.

According to the second embodiment, as hereinabove described, the recessed SOG films 32 and the downwardly projecting SiN films 33 having the refractive index (about 2.05) larger than the refractive index (about 1.4) of the SOG films 32 and formed to fill up the recessed portions of the SOG films 32 are provided above the photoreceptive parts 27 of the solid state image sensor 23 so that the downwardly projecting surfaces (lower surfaces) of the SiN films 33 defining the boundaries between the SiN films 33 and the SOG films 32 can inwardly refract light incident upon the SOG films 32 from the SiN films 33 serving as microlenses also when the solid state image sensor 23 and the optical lens 24 are integrally formed through the resin layer 25 having the refractive index of about 1.5. Thus, the solid state image device, capable of condensing the light incident upon the SOG films 32 from the downwardly projecting SiN films 33, can be formed with high condensability.

According to the second embodiment, further, the lower surfaces of the SiN films 33 defining the boundaries between the SiN films 33 and the SOG films 32 can refract light, whereby no difference may be provided between the refractive indices of the resin layer 25 and the SiN films 33. Thus, the material for the resin layer 25 can be selected regardless of the refractive index of the SiN films 33, whereby the degree of freedom in selection of the material for the resin layer 25 can be enlarged.

A method of manufacturing the solid state image device according to the second embodiment is now described with reference to FIGS. 10 to 19.

Figure 11:
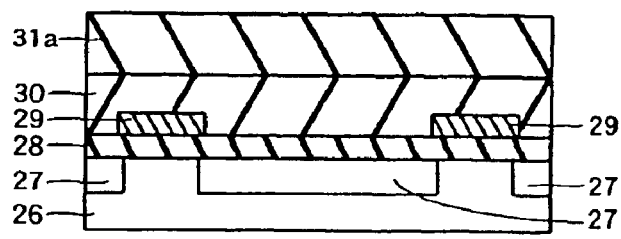
FIGS. 11 to 13 are sectional views for illustrating a method of manufacturing the solid state image device according to the second embodiment shown in FIG. 10.

First, the interlayer dielectric film 28 of $SiO_2$ having the thickness of about 0.6 μm is formed on the Si substrate 26 formed with the photoreceptive parts 27, as shown in FIG. 11. Then, the shielding films 29 of Al having the thickness of about 150 nm are formed on the prescribed regions of the interlayer dielectric film 28. Thereafter the interlayer dielectric film 30 of $SiO_2$ having the thickness of about 1.7 μm is formed to cover the shielding films 29 and the interlayer dielectric film 28. Thereafter an $SiO_2$ film 31a having a thickness of about 2.5 μm is formed on the interlayer dielectric film 30 by CVD.

Figure 12:
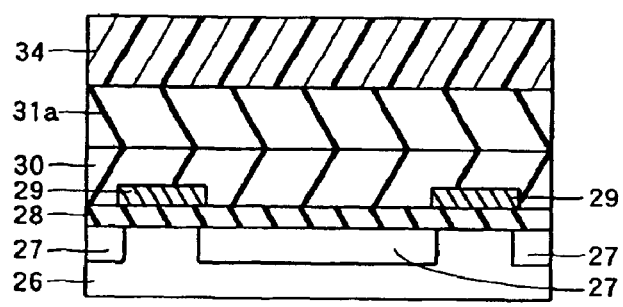
Figure 13:
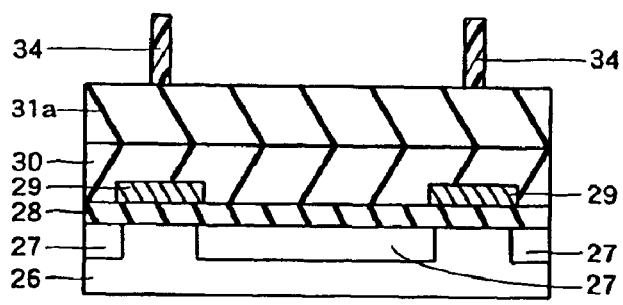
Figure 14:
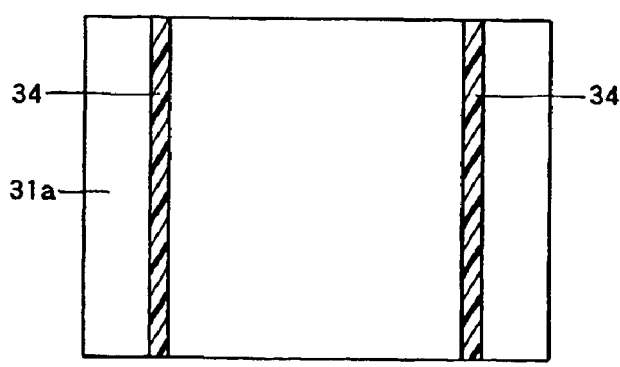
FIG. 14 is a plan view for illustrating the method of manufacturing the solid state image device according to the second embodiment shown in FIG. 10.

Then, a resist layer 34 is applied onto the $SiO_2$ film 31a, as shown in FIG. 12. The resist layer 34 is worked into resist films 34 of about 0.13 μm in width by lithography so that the distance between each adjacent pair of the resist films 34 is about 5 μm, as shown in FIGS. 13 and 14.

Figure 15:
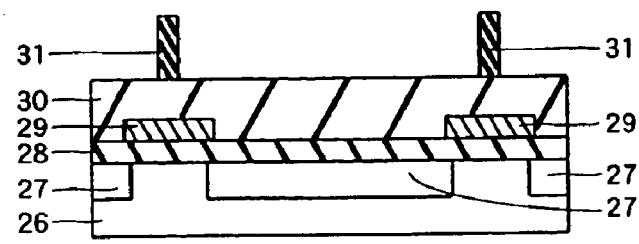
FIG. 15 is a sectional view for illustrating the method of manufacturing the solid state image device according to the second embodiment shown in FIG. 10.
Figure 16:
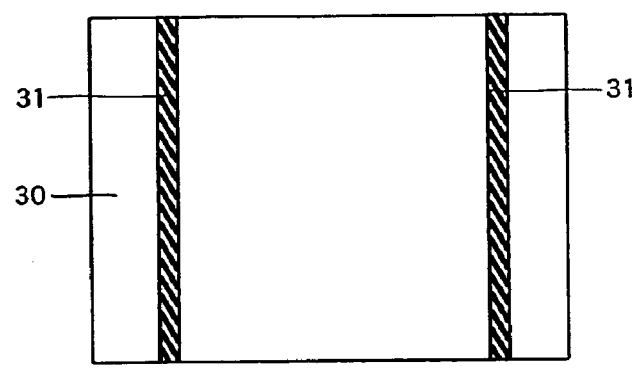
FIG. 16 is a plan view for illustrating the method of manufacturing the solid state image device according to the second embodiment shown in FIG. 10.

The resist films 34 are employed as masks for etching the $SiO_2$ film 31a thereby forming the columnar parts 31 having the width of about 0.13 μm and the height of about 2.5 μm in the form of a lattice in plan view, as shown in FIGS. 15 and 16. These columnar parts 31 are so formed that the distance between each adjacent pair of the columnar parts 31 is about 5 μm. Thereafter the resist films 34 are removed.

Figure 17:
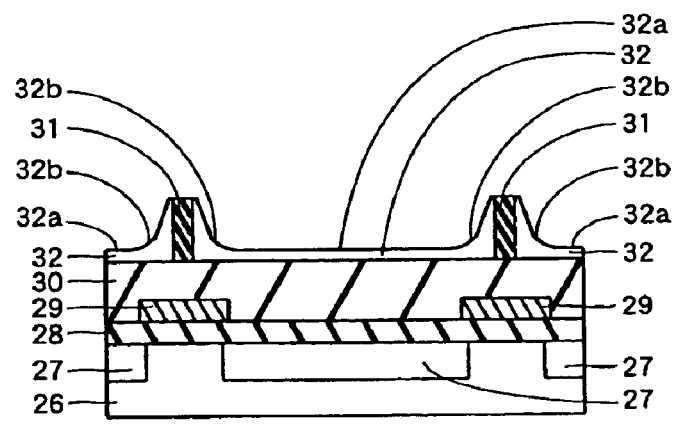
FIGS. 17 to 19 are sectional views for illustrating the method of manufacturing the solid state image device according to the second embodiment shown in FIG. 10.

Then, the recessed SOG films 32 are applied onto the interlayer dielectric film 30 by spin coating to cover the side surfaces of the columnar parts 31, as shown in FIG. 17. At this time, the flat portions 32a of the SOG films 32 are formed to have the width of about 2 μm and the thickness of about 0.5 μm, and the curved portions 32b are formed with the radius of curvature of about 2.3 μm.

Figure 18:
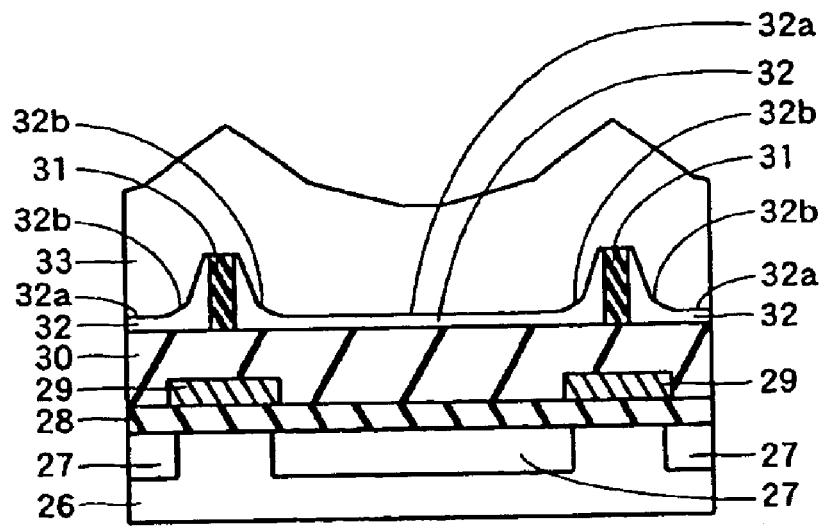
Figure 19:
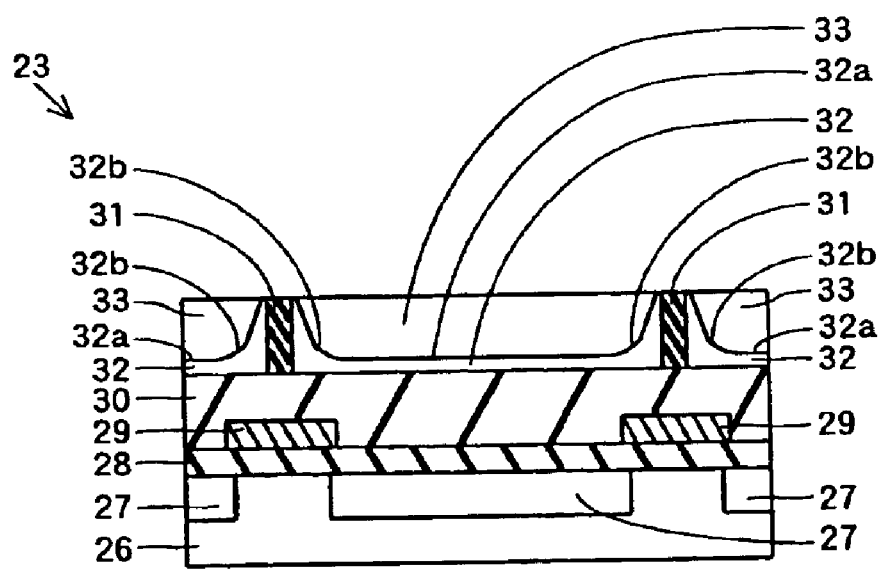

Then, the SiN films 33 are formed by CVD with a thickness of 3 μm to fill up the recessed portions of the SOG films 32 while covering the overall SOG films 32, as shown in FIG. 18. Thereafter the upper surfaces of the SiN films 33 are polished by CMP (chemical mechanical polishing), to be flattened and substantially flush with the upper surfaces of the columnar parts 31. More specifically, the upper surfaces of the SiN films 33 are polished until the thickness of the SiN films 33 reaches about 2 μm. Thus, the solid state image sensor 23 is formed to include the SiN films 33 having downwardly projecting shapes for serving as microlenses.

Finally, the solid state image sensor 23 and peripheral circuits (not shown) are built on a package substrate (not shown). The solid state image sensor 23 and the optical lens 24 are integrally formed through the resin layer 25 of the epoxy resin having the thickness of about 1 mm to about 2 mm. Thus, the solid state image device according to the second embodiment is formed.

Although the present invention has been described and illustrated in detail, it is clearly understood that the same is by way of illustration and example only and is not to be taken by way of limitation, the spirit and scope of the present invention being limited only by the terms of the appended claims.

For example, while the SiN films 11 and 12 or 33 are employed as microlenses in each of the aforementioned first and second embodiments, the present invention is not restricted to this but another film consisting of a material having a high refractive index may alternatively be employed as a microlens. In this case, the material preferably has a refractive index of at least about 1.8. The material having a high refractive index may be prepared from titanium oxide having a refractive index of about 2.76, lead titanate having a refractive index of about 2.7, potassium titanate having a refractive index of about 2.68, anatase-type titanium dioxide having a refractive index of about 2.52, zirconium oxide having a refractive index of about 2.4, zinc sulfide having a refractive index of about 2.37 to about 2.43, antimony oxide having a refractive index of about 2.09 to about 2.29, zinc oxide having a refractive index of about 2.01 to about 2.03 or white lead having a refractive index of about 1.94 to about 2.09, for example.

While the SiN film 12 consisting of the same material as the SiN film 11 is formed between the resin layer 5 and the SiN film 11 in the aforementioned first embodiment, the present invention is not restricted to this but the SiN film 12 may alternatively be replaced with a film having a refractive index larger than that of the resin layer 5 and smaller than that of the lower SiN film 11. When the resin layer 5 has the refractive index of about 1.5 and the lower SiN film 11 has the refractive index of about 2.05, for example, an SiON film having a refractive index of about 1.8 to about 1.9 may be formed between the resin layer 5 and the lower SiN film 11. In this case, the SiON film can relax the difference between the refractive indices of the resin layer 5 and the SiN film 11.

Thus, the quantity of reflection of light incident upon the SiN film 11 from the resin layer 5 can be inhibited from increase resulting from large difference between the refractive indices, whereby condensation efficiency can be inhibited from reduction.

While the SiN film 11 having the radius of curvature of about 2.82 µm is formed in the aforementioned first embodiment, the present invention is not restricted to this but a film having another radius of curvature may alternatively be formed. In this case, condensation efficiency can be further improved by reducing the radius of curvature of the film. Also when the radius of curvature of the film is increased, reduction of the condensation efficiency can be suppressed by increasing the thickness of an interlayer film formed on the lower surface of this film.

While the thin resist portion remaining between each adjacent pair of the resist films 13a is removed from the SiN film 11 by ashing before etching the SiN film 11 through the resist films 13a serving as masks in the aforementioned first embodiment, the present invention is not restricted to this but the remaining resist portion may alternatively be ashed after the etching.

While the recessed SOG films 32 having the flat portions 32a of about 2 µm in width are formed on the upper interlayer dielectric film 30 in the aforementioned second embodiment, the present invention is not restricted to this but recessed films having flat portions of another width may alternatively be formed. If spin coating is employed in this case, the radius of curvature of curved portions remain unchanged also when the width of the flat portions is increased to 4 µm.

Figure 20:
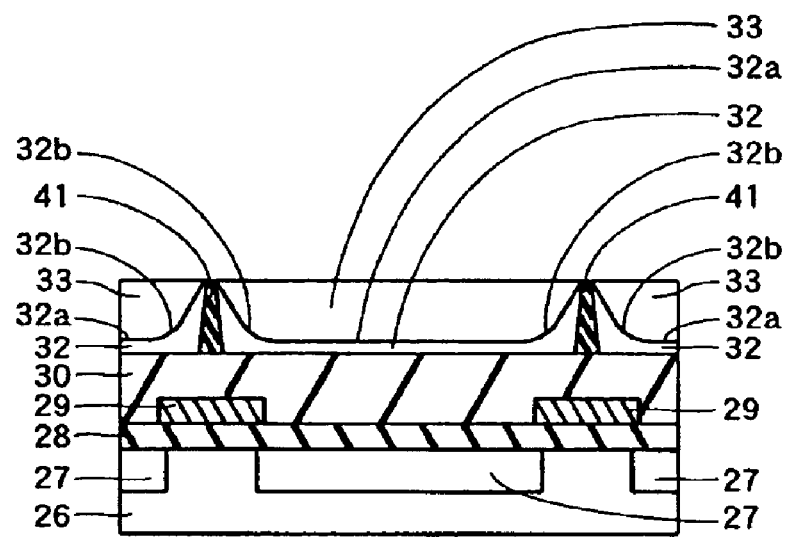
FIG. 20 is a sectional view of a solid state image device according to a modification of the second embodiment of the present invention.
Figure 21:
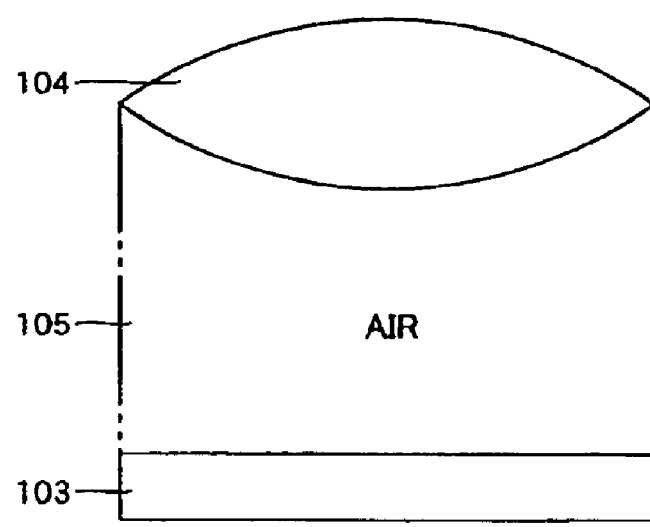
FIG. 21 is a schematic diagram showing the overall structure of a conventional solid state image device.
Figure 22:
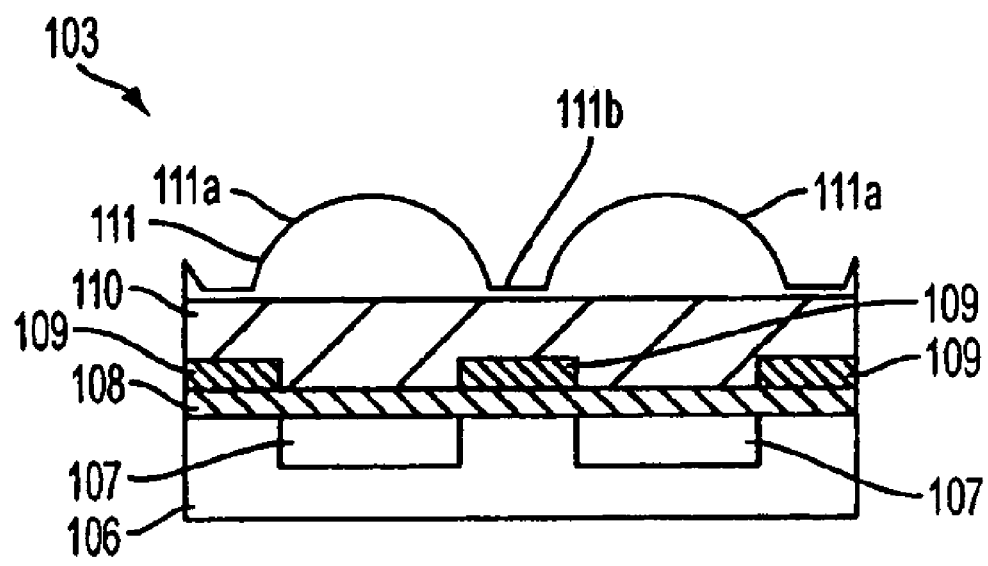
FIG. 22 is a sectional view of a solid state image sensor part of the conventional solid state image device shown in FIG. 20.

While each columnar part 31 is in the form of a rectangle having the upper and lower portions of the same width in the aforementioned second embodiment, the present invention is not restricted to this but the upper portion of each columnar part 31 may alternatively have a width larger than that of the lower portion. In other words, each columnar part 41 may have such an upwardly tapered shape that the upper portion thereof is smaller in width than the lower portion as in a modification of the second embodiment shown in FIG. 20. Each columnar part 41 is first formed with the upper and lower portions having the same width and thereafter subjected to wet etching or isotropic etching, to have the upwardly tapered shape as shown in FIG. 20. In this case, the forward end of the upper portion of each columnar part 41 may be sharpened.

In the modification of the second embodiment shown in FIG. 20, the upper portion of each columnar part 41 is smaller in width than the lower portion as hereinabove described, whereby the interval between each adjacent pair of SiN films 33 serving as microlenses can be so reduced that the length of downwardly projecting surfaces of the SiN films 33 can be increased. Thus, the areas of the SiN films 33 can be so increased as to further improve condensation efficiency.

The package substrate 1 employed in the aforementioned first embodiment may be replaced with an SiP (System in Package) substrate.

What is claimed is:

1. A solid state image device comprising:
   an optical lens with a lower surface;
   a solid state image sensor including a microlens; and
   a resin layer formed between said optical tens and said microlens of said solid state image sensor wherein the resin layer contacts said microlens and the lower surface of said optical lens.

2. The solid state image device according to claim 1, wherein
   said optical lens and said microlens of said solid state image sensor are integrally formed through said resin layer.

3. The solid state image device according to claim 1, wherein
   said microlens of said solid state image sensor has a refractive index larger than the refractive index of said resin layer.

4. The solid state image device according to claim 1, wherein
   said microlens of said solid state image sensor includes:
   a first film having an upwardly projecting shape, and a second film, formed on said first film, having an upwardly projecting shape reflecting said upwardly projecting shape of said first film.

5. The solid state image device according to claim 4, wherein
   said first film and said second film are made of materials having the same refractive index.

6. The solid state image device according to claim 5, wherein
   said first film and said second film are formed by SiN films.

7. The solid state image device according to claim 4, wherein
   said first film is formed with a plurality of said upwardly projecting shapes at prescribed intervals, and
   said second film is formed with a plurality of said upwardly projecting shapes to fill up gaps of said first film.

8. The solid state image device according to claim 7, wherein
   each adjacent pair of said upwardly projecting shapes of said second film are connected with each other to include no substantially flat region on the boundary therebetween.

9. The solid state image device according to claim 7, wherein
   the boundary between each adjacent pair of said upwardly projecting shapes of said second film has a thickness of at least 10 nm.

10. The solid state image device according to claim 1, further comprising a recessed third film formed on said solid state image sensor, wherein
    said microlens of said solid state image sensor includes a fourth film, embedded in the recessed portion of said third film, exhibiting a larger refractive index than said third film and having a downwardly projecting shape.

11. The solid state image device according to claim 10, wherein
    said fourth film is formed by an SiN film.

12. The solid state image device according to claim 11, wherein
    said third film is formed by an SOG film.

* * * * *

UNITED STATES PATENT AND TRADEMARK OFFICE
CERTIFICATE OF CORRECTION

PATENT NO.     : 6,974,717 B2
DATED          : December 13, 2005
INVENTOR(S)    : Makoto Izumi et al.

It is certified that error appears in the above-identified patent and that said Letters Patent is hereby corrected as shown below:

<u>Title page, Item [54] and Column 1, line 1,</u>
Title, change "SOLID STATE IMAGE DEVICE, AND INCLUDING AN OPTICAL LENS AND A MICROLENS" to -- SOLID STATE IMAGE DEVICE INCLUDING AN OPTICAL LENS AND A MICROLENS --.

Signed and Sealed this

Ninth Day of May, 2006

JON W. DUDAS
*Director of the United States Patent and Trademark Office*